United States Patent
Kim et al.

(10) Patent No.: US 9,099,193 B2
(45) Date of Patent: Aug. 4, 2015

(54) DATA STORAGE DEVICE AND OPERATING METHOD THEREOF

(71) Applicant: SK hynix Inc., Icheon-si (KR)

(72) Inventors: Eui Jin Kim, Icheon-si (KR); Seok Jin Joo, Icheon-si (KR); Yong Il Jung, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 183 days.

(21) Appl. No.: 13/950,083

(22) Filed: Jul. 24, 2013

(65) Prior Publication Data

US 2014/0173184 A1 Jun. 19, 2014

(30) Foreign Application Priority Data

Dec. 18, 2012 (KR) ........................ 10-2012-0148171

(51) Int. Cl.
*G06F 12/02* (2006.01)
*G11C 16/34* (2006.01)
*G11C 11/56* (2006.01)
*G11C 16/10* (2006.01)

(52) U.S. Cl.
CPC ........ *G11C 16/3459* (2013.01); *G11C 11/5628* (2013.01); *G11C 16/10* (2013.01)

(58) Field of Classification Search
CPC . G11C 16/3459; G11C 11/5628; G11C 16/10
USPC .............. 711/103, 108, 154, 156; 365/185.33
See application file for complete search history.

(56) References Cited

U.S. PATENT DOCUMENTS

| | | | | |
|---|---|---|---|---|
| 5,712,815 A * | 1/1998 | Bill et al. | ................. | 365/185.03 |
| 5,761,124 A * | 6/1998 | Sato et al. | ................. | 365/185.22 |
| 5,768,193 A * | 6/1998 | Lee et al. | ................. | 365/185.25 |
| 6,243,290 B1 * | 6/2001 | Kurata et al. | ............ | 365/185.03 |
| 7,164,601 B2 * | 1/2007 | Mitani et al. | ............. | 365/185.03 |
| 7,313,649 B2 * | 12/2007 | Tomita et al. | ................. | 711/103 |
| 7,466,592 B2 * | 12/2008 | Mitani et al. | ............... | 365/185.2 |
| 7,929,346 B2 * | 4/2011 | Yu et al. | ................... | 365/185.09 |
| 8,085,587 B2 * | 12/2011 | Lim | ........................ | 365/185.03 |
| 8,111,548 B2 * | 2/2012 | Mokhlesi | ................. | 365/185.03 |
| 8,174,903 B2 * | 5/2012 | Han et al. | ................. | 365/185.25 |
| 8,218,363 B2 * | 7/2012 | Kim et al. | ................ | 365/185.03 |
| 8,335,110 B2 * | 12/2012 | Tanaka et al. | ............ | 365/185.18 |
| 8,520,444 B2 * | 8/2013 | Cho | ......................... | 365/185.25 |
| 2006/0181934 A1 * | 8/2006 | Shappir et al. | ........... | 365/185.33 |
| 2009/0231928 A1 * | 9/2009 | Kim | ........................ | 365/185.22 |
| 2011/0239096 A1 * | 9/2011 | Nawata | ........................ | 714/801 |
| 2015/0003151 A1 * | 1/2015 | Lee | ........................... | 365/185.02 |

FOREIGN PATENT DOCUMENTS

KR  1020100133611 A  12/2010
KR  1020120028035 A  3/2012

* cited by examiner

*Primary Examiner* — Stephen Elmore
(74) *Attorney, Agent, or Firm* — Kilpatrick Townsend & Stockton LLP

(57) ABSTRACT

A method of operating a data storage device includes setting program verify voltages for verifying whether memory cells of a nonvolatile memory device are programmed to desired program states; transmitting the set program verify voltages to the nonvolatile memory device; generating data patterns respectively corresponding to program states based on the program verify voltages; transmitting a data pattern corresponding to the program verify voltages to the nonvolatile memory device; and programming the memory cells with the transmitted data pattern.

21 Claims, 11 Drawing Sheets

US 9,099,193 B2

DATA STORAGE DEVICE AND OPERATING METHOD THEREOF

CROSS-REFERENCES TO RELATED APPLICATION

The present application claims priority under 35 U.S.C. §119(a) to Korean application number 10-2012-0148171, filed on Dec. 18, 2012, in the Korean Intellectual Property Office, which is incorporated herein by reference in its entirety.

BACKGROUND

1. Technical Field

Various embodiments presented herein relate to a data storage device, and more particularly, to a data storage device with an increased storage capacity and a method for increasing a storage capacity thereof.

2. Related Art

Computing has become ubiquitous so that computer systems can be used anytime and anywhere. Consequently, the use of portable electronic devices such as mobile phones, digital cameras, and notebook computers has rapidly increased. In general, such portable electronic devices use a data storage device which includes a memory device. The data storage device is used as a main memory device or an auxiliary memory device of a portable electronic device.

A semiconductor based data storage device using a memory device provides advantages in that, since there is no mechanical driving part, stability and durability are excellent, an information access speed is high and power consumption is low. Data storage devices having such advantages include a USB (universal serial bus) memory device, a memory card having various interfaces, and a solid state drive (SSD).

As large capacity files such as music files and video files are reproduced in a portable electronic device, a data storage device with a large storage capacity is required. In order to secure the large storage capacity, the data storage device may include a plurality of memory devices. A significant factor impacting the storage capacity of a data storage device is the number of bits that can be stored in each memory cell of a memory device. That is to say, a storage capacity of a memory device is determined according to the number of bits each memory cell can store when the memory device is designed. If the number of bits capable of being stored in each is memory cell of a memory device can be logically changed according to the control of a memory controller, the storage capacity of a data storage device may be increased.

SUMMARY

A data storage device whose storage capacity can be increased under the control of a memory controller and a method for achieving the same are described herein.

One implementation is a method of operating a data storage device. The method includes setting a plurality of program verify voltages for verifying whether memory cells of a nonvolatile memory device are programmed to one of a plurality of program states, transmitting one of the program verify voltages to the nonvolatile memory device, and generating a data pattern corresponding to the one program state, where the data pattern is based on the transmitted program verify voltage. The method also includes transmitting the data pattern to the memory device, and programming the memory cells with the data pattern according to the transmitted program verify voltage.

Another implementation is a data storage device including a nonvolatile memory device including memory cells, and a controller configured to control the nonvolatile memory device, where the controller is configured to set a plurality of program verify voltages for verifying whether the memory cells are programmed to one of a plurality of program states, and to provide the program verify voltages to the nonvolatile memory device. The nonvolatile memory device is configured to update a program verify voltage based on the program verify voltage provided from the controller and to perform a program operation according to the updated program verify voltage.

Another implementation is a method of operating a data storage device including memory cells. The method includes determining a default program states for each the memory cells, adding a new valid program state for the memory cells, receiving input data from a host device, and generating a data pattern configured to program each of the memory cells to one of the default program state and the new program state according to the input data, The method also includes transmitting the data pattern to the memory cells, and programming the memory cells with the data pattern according to the transmitted program verify voltages.

BRIEF DESCRIPTION OF THE DRAWINGS

Features, aspects, and embodiments are described in conjunction with the attached drawings, in which.

DETAILED DESCRIPTION

Figure 1:
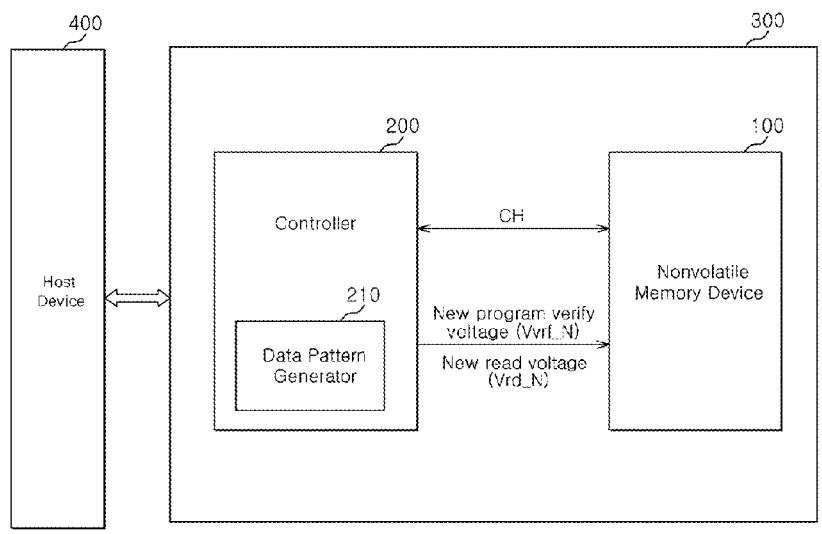
FIG. 1 is a block diagram exemplarily showing a data processing system including a data storage device in accordance with an embodiment.

In the following description, advantages, features, and methods for achieving them are described with reference to the drawings. The invention may, however, be embodied in different forms and should not be construed as being limited to the embodiments set forth herein. Rather, these embodiments are provided to describe various aspects and features.

It is to be understood herein that embodiments are not limited to the particulars shown in the drawings and that the drawings are not necessarily to scale and in some instances proportions may have been exaggerated, for example, in order to more clearly depict certain features. While particular terminology is used herein, it is to be appreciated that the terminology used herein is for the purpose of describing particular embodiments only and is not intended to limit the scope.

As used herein, the term "and/or" includes any and all combinations of one or more of the associated listed items. It will be understood that when an element is referred to as being "on," "connected to" or "coupled to" another element, it may be directly on, connected or coupled to the other element or intervening elements may be present. As used herein, a singular form is intended to include plural forms as well, unless the context indicates otherwise. It will be further understood that the terms "includes" and/or is "including," when used in this specification, specify the presence of at least one stated feature, step, operation, and/or element, but do not preclude the presence or addition of one or more other features, steps, operations, and/or elements thereof.

Hereinafter, a data storage device and an operating method thereof are described below with reference to the accompanying drawings through exemplary embodiments.

FIG. 1 is a block diagram exemplarily showing a data processing system including a data storage device in accordance with an embodiment. Referring to FIG. 1, a data processing system 500 includes a host device 400 and a data storage device 300.

The host device 400 includes, for example, a portable electronic device such as a mobile phone, an MP3 player, and so forth, or an electronic device such as a laptop computer, a desktop computer, a game machine, a TV, a beam projector, and so forth.

The data storage device 300 is configured to operate in response to a request from the host device 400. The data storage device 300 is configured to store data accessed by the host device 400. In other words, the data storage device 300 may be used as a main memory device or an auxiliary memory device of the host device 400. The data storage device 300 includes a controller 200 and a nonvolatile memory device 100. The controller 200 and the nonvolatile memory device 100 may be part of a memory card which is connected with the host device 400 through an interface. Alternatively, the controller 200 and the nonvolatile memory device 100 may be part of a solid state drive (SSD).

The controller 200 may be configured to control the nonvolatile memory device 100 in response to a request from the host device 400. For example, the controller 200 is configured to provide data read from the nonvolatile memory device 100, to the host device 400. As another example, the controller 200 may be configured to store data provided from the host device 400, to the nonvolatile memory device 100. For these operations, the controller 200 is configured to control read, program (or write) and erase operations of the nonvolatile memory device 100.

For instance, the nonvolatile memory device 100 may include a NAND flash memory device. However, it will be appreciated that the nonvolatile memory device 100 may include another nonvolatile memory device instead of the NAND flash memory device. The nonvolatile memory device 100 includes a plurality of memory cells. Each of the memory cells may store 1-bit data or 2 or more-bit data.

A memory cell capable of storing 1-bit data is referred to as a single level cell (SLC). The single level cell (SLC) is programmed to have a threshold voltage which corresponds to an erase state and one program state. A memory cell capable of storing 2 or more-bit data is referred to as a multi-level cell (MLC). The multi-level cell (MLC) is programmed to have a threshold voltage which corresponds to an erase state and any one of a plurality of program states.

Memory cells of the nonvolatile memory device 100 are programmed through a program operation of raising the threshold voltage of the memory cells by applying a program voltage and a program verify operation of verifying whether the memory cells are programmed to a desired program state. According to some embodiments, a program verify voltage of the nonvolatile memory device 100 may be updated with a new program verify voltage Vvrf_N by the controller 200. Thereafter, the nonvolatile memory device 100 is configured to perform a program operation according to the new program verify voltage Vvrf_N.

By controlling the program verify voltage of the nonvolatile memory device 100, the threshold voltage of the memory cells may be controlled to a desired state. In other words, if the program operation of the nonvolatile memory device 100 is performed according to the new program verify voltage Vvrf_N, the number of program states may be increased. For example, a single level cell (SLC) designed to have one program state may be programmed to have a plurality of program states including a default program state. In another example, a multi-level cell (MLC) designed to have a default number of program states may be programmed to have program states more than default number of program states. If the number of program states of the memory cells is increased, a storage capacity of the memory cells is correspondingly increased.

Even though the number of program states of the memory cells of the nonvolatile memory device 100 is increased, physical circuits used to program the memory cells and an operating scheme is of such circuits are not changed. Therefore, without changing the physical structure of the nonvolatile memory device 100, the number of program states of the memory cells may be increased. For example, by using a circuit for programming a single level cell (SLC) and an operating scheme of such a circuit, the single level cell (SLC) may be programmed to have a plurality of program states.

The controller 200 is configured to generate new program states for the memory cells by providing the new program verify voltage Vvrf_N and then providing data for programming the memory cells with the new program state. To this end, the controller 200 includes a data pattern generator 210. The data pattern generator 210 may be configured in hardware, software, or a combination of hardware and software.

The data pattern generator 210 is configured to generate a data pattern to be provided to the nonvolatile memory device 100, on the basis of the data input from the host device 400. The data pattern generator 210 generates the data pattern to program the memory cells to either a default program state and a new program state according to the new program verify voltage Vvrf_N. That is to say, the data pattern generator 210 is configured to generate a data pattern for using an increased storage capacity of the memory cells, on the basis of the data input from the host device 400. A data pattern generating method of the data pattern generator 210 is described in detail below with reference to FIG. 7.

Because the number of possible program states of the memory cell of the nonvolatile memory device 100 is increased, control is needed to read the memory cells which are programmed to the new program state. According to some embodiments, a read voltage of the nonvolatile memory device 100 may be updated with a new read voltage Vrd_N provided from the controller 200. Further, the nonvolatile memory device 100 is configured to perform a read operation according to the new read voltage Vrd_N. A data pattern read according to the new read voltage Vrd_N is generated as or converted into original data, that is, the data input from the host device 400, by the data pattern generator 210. In some embodiments, this procedure may be performed in a reverse order as the procedure for generating the data pattern for programming the data inputted from the host device 400.

Figure 2:
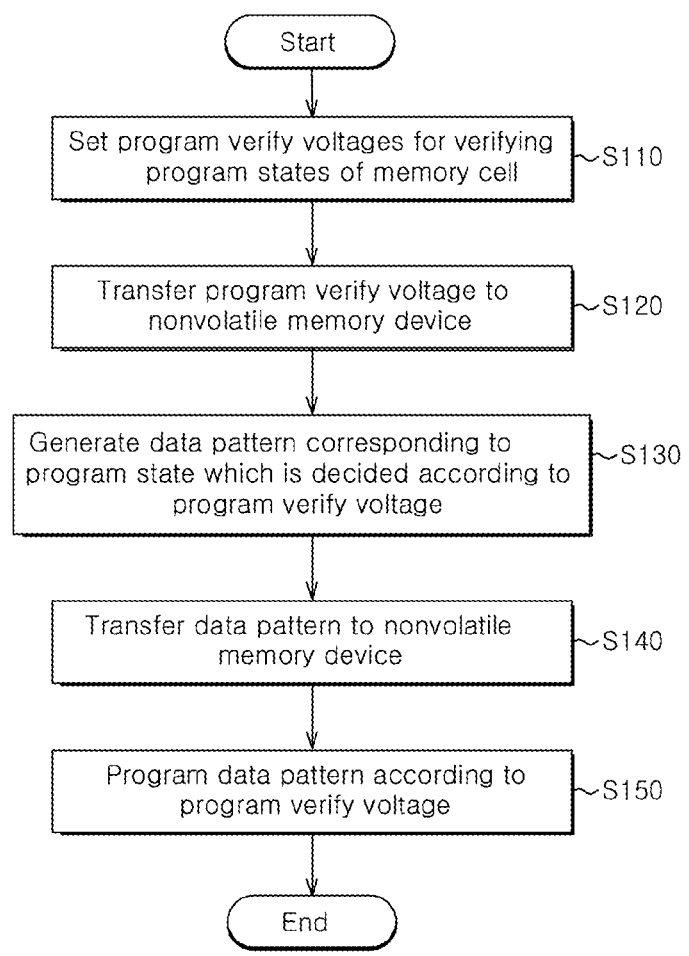
FIG. 2 is a flow chart exemplarily showing a program method of a data storage device in accordance with an embodiment.

FIG. 2 is a flow chart exemplarily showing a program method for a data storage device in accordance with an embodiment. FIG. 2 shows operations of the controller 200 (see FIG. 1) and the nonvolatile memory device 100 (see FIG. 1) for storing the data input from the host device 400 (see FIG. 1).

In step S110, the controller 200 sets program verify voltages for verifying program states of the memory cells of the nonvolatile memory device 100. The controller 200 may set a program verify voltage for verifying the default program state of the memory cells. In order to increase the storage capacity of the memory cells of the nonvolatile memory device 100, the controller 200 may newly generate a program state for the memory cells and is may set a program verify voltage for verifying whether the memory cells are programmed with the new program state. In other words, the controller 200 may set program verify voltages for verifying the program state of the memory cells.

In step S120, the controller 200 transmits a program verify voltage to the nonvolatile memory device 100. Namely, the controller 200 transmits a program verify voltage for updating a program verify voltage. The program verify voltage transmitted from the controller 200 may be any one of the program verify voltages set in step S110.

In step S130, the controller 200 generates data patterns corresponding to the program states based on the set program verify voltages. The data pattern generator 210 of the controller 200 generates data patterns on the basis of the data input from the host device 400. To this end, the data pattern generator 210 rearranges the data from the host device 400. The data pattern generator 210 generates the data patterns based on the rearranged data in such a manner that the memory cells are programmed to any of the program states of the memory cells, that is, the default program state and the program state newly generated to increase the storage capacity of the memory cells.

In step S140, the controller 200 transmits a data pattern to the nonvolatile memory device 100. The data pattern transmitted in step S140 is a data pattern which corresponds to the program verify voltage transmitted in step S120. That is to say, a data pattern which should be programmed to the memory cells according to the transmitted program verify voltage is transmitted. In step S150, the nonvolatile memory device 100 programs the data pattern transmitted according to the provided program verify voltage, to corresponding memory cells.

Figure 3:
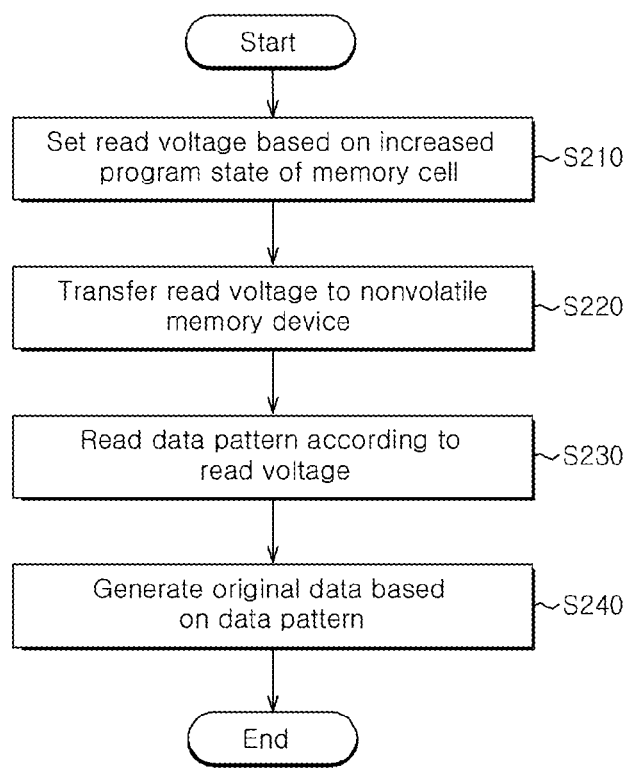
FIG. 3 is a flow chart exemplarily showing a read method of a data storage device in accordance with an embodiment.

FIG. 3 is a flow chart exemplarily showing a read method of a data storage device in accordance with an embodiment. FIG. 3 shows operations of the controller 200 (see FIG. 1) and the nonvolatile memory device 100 (see FIG. 1) for providing data stored in the nonvolatile memory device 100 to the host device 400 (see FIG. 1). In describing FIG. 3, it is assumed that the nonvolatile memory device 100 is programmed according to the program method of FIG. 2.

In step S210, the controller 200 sets a read voltage on the basis of the new program state of the nonvolatile memory device 100. In other words, the controller 200 sets read voltages for reading the program states of the memory cells of the nonvolatile memory device 100.

In step S220, the controller 200 transmits a read voltage to the nonvolatile memory device 100. For example, the controller 200 transmits a read voltage for updating a default read voltage which is set when designing the nonvolatile memory device 100.

In step S230, the nonvolatile memory device 100 reads data according to the read voltage provided from the controller 200. In step S240, the controller 200 generates the original data on the basis of the read data pattern. That is to say, the data pattern generator 210 of the controller 200 generates the original data from the host device 400, on the basis of the read data pattern. In some embodiments, this operation of the data pattern generator 210 may be performed in a reverse order of the procedure for generating the data pattern for programming the data from the host device 400.

Figure 4:
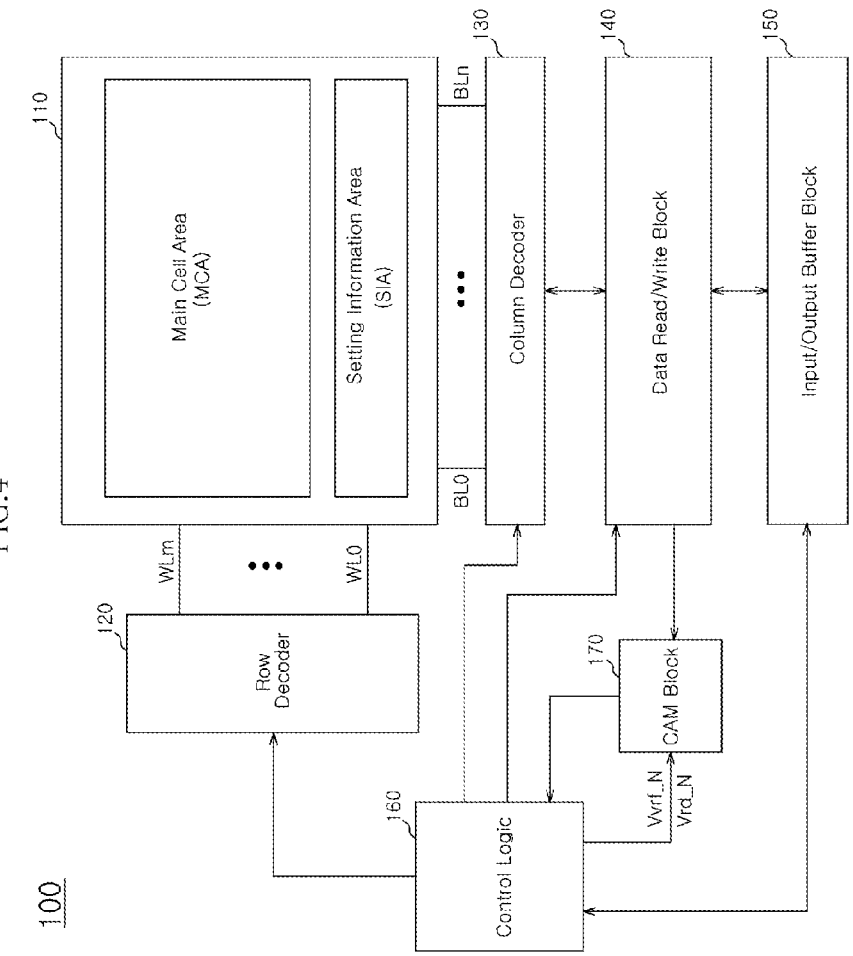
FIG. 4 is a block diagram exemplarily showing a nonvolatile memory device in accordance with an embodiment.

FIG. 4 is a block diagram exemplarily showing a nonvolatile memory device in accordance with an embodiment. Referring to FIG. 4, a nonvolatile memory device 100 includes a memory cell array 110, a row decoder 120, a column decoder 130, a data read/write block 140, an input/output buffer block 150, a control logic 160, and a CAM (content addressed memory) block 170.

The memory cell array 110 includes a main cell area (MCA) and a setting information area (SIA). The main cell area (MCA) includes memory cells for storing data provided from an external device (not shown). The setting information area (SIA) includes memory cells for storing setting information necessary for operations of the nonvolatile memory device 100. The memory cells included in the main cell area (MCA) and the setting information area (SIA) may be arranged at regions where word lines WL0 to WLm and bit lines BL0 to BLn cross with each other.

Because the setting information area (SIA) is an area for storing setting information, the setting information area (SIA) may be a hidden area which is hidden from or not directly accessible to a user. The setting information stored in the setting information area (SIA) includes at least one of a bias level (for example, a read voltage, a program voltage, a program verify voltage, and the like) and a bias apply time for the operations of the nonvolatile memory device 100, setting information of the control logic 160, failed address information, repair address information, and redundancy information.

While power is applied to the nonvolatile memory device 100 and an initializing operation is performed, the setting information stored in the setting information area (SIA) is read through the data read/write block 140. The read setting information is stored (or loaded) in the CAM block 170. For the sake of convenience in explanation, the CAM block 170 is shown as one function block. However, depending upon the contents (or kinds) of the setting information, the CAM block 170 may be included in one or more circuit blocks which drive the memory cell array 110 (for example, the row decoder 120, the column decoder 130, the data read/write block 140 and the control logic 160). The setting information stored in the CAM block 170 is referred to by the respective circuit blocks during the operations of the nonvolatile memory device 100 (for example, the row decoder 120, the column decoder 130, the data read/write block 140 and the control logic 160).

The row decoder 120 is connected with the memory cell array 110 through the word lines WL0 to WLm. The row decoder 120 operates under the control of the control logic 160. The row decoder 120 is configured to decode an address which is pre-decoded by the control logic 160. The row decoder 120 is configured to perform a selecting operation and a driving operation for the word lines WL0 to WLm according to a decoding result. For instance, the row decoder 120 may provide an operating voltage provided from a voltage generator (not shown), to the respective word lines WL0 to WLm.

The column decoder 130 is connected with the memory cell array 110 through the bit lines BL0 to BLn. The column decoder 130 operates under the control of the control logic 160. The column decoder 130 is configured to decode an address which is pre-decoded by the control logic 160. The column decoder 130 is configured to sequentially connect the bit lines BL0 to BLn with the data read/write block 140 according to a decoding result.

The data read/write block 140 operates under the control of the control logic 160. The data read/write block 140 is configured to operate as a write driver or a sense amplifier according to an operation mode. For example, the data read/write block 140 may be configured to store data provided from the external device to the memory cell array 110 in a program operation. In addition, the data read/write block 140 may be configured to read data from the memory cell array 110 in a read operation.

The input/output buffer block 150 is configured to receive data from an external device (for example, a memory controller, a memory interface, and the like) or output data to the external device. For these functions, the input/output buffer block 150 may include a data latch circuit (not shown) and an output driving circuit (not shown).

The control logic 160 is configured to control general operations of the nonvolatile memory device 100 in response to control signals provided from the external device. For example, the control logic 160 may control read, write (or program) and erase operations of the nonvolatile memory device 100.

Among the setting information read from the setting information area (SIA) and stored (or loaded) in the CAM block 170, a program verify voltage and a read voltage may be updated or modified. For example, if a program verify voltage Vvrf_N for newly generating a program state capable of being owned by memory cells is provided from the controller 200 (see FIG. 1), the provided program verify voltage Vvrf_N is stored in the CAM block 170 according to the control of the control logic 160. Through this operation, setting information for the program verify voltage stored in the CAM block 170 may be updated as the new program verify voltage Vvrf_N. In another example, if a read voltage Vrd_N for reading memory cells programmed to a default program state and a new program state is provided from the controller 200 (see FIG. 1), the provided read voltage Vrd_N is stored in the CAM block 170 according to the control of the control logic 160. Through this operation, setting information for the read voltage stored in the CAM block 170 may be updated.

The control logic 160 controls read, write and erase operations according to the setting information stored in the CAM block 170. If the setting information stored in the CAM block 170 is updated as described above, the control logic 160 controls read, write and erase operations according to the updated setting information.

Figure 5:
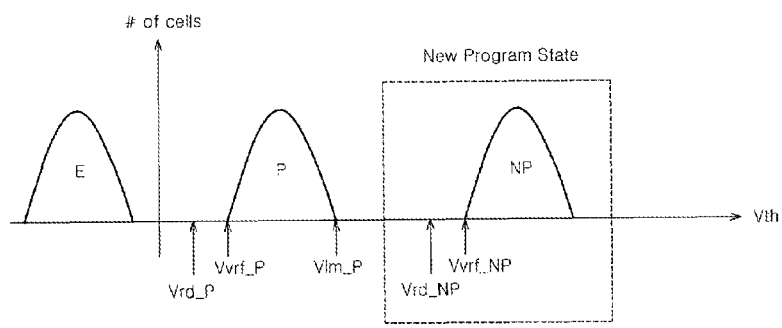
FIG. 5 is a threshold voltage distribution graph conceptually explaining a method for increasing a storage capacity of a memory cell in accordance with an embodiment.

FIG. 5 is a threshold voltage distribution graph conceptually illustrating a method for increasing a storage capacity of a memory cell in accordance with an embodiment. In describing FIG. 5, it is assumed that memory cells have an erase state E and one program state P as the default.

In a program verify operation, a program verify voltage Vvrf_P is applied to word lines of selected memory cells. The program verify voltage Vvrf_P is a voltage for verifying whether the memory cells are programmed to a program state P. When the memory cells are read according to the program verify voltage Vvrf_P, a memory cell of which threshold voltage is higher than the program verify voltage Vvrf_P is recognized as an off cell. The off cell is accordingly known to be programmed. Conversely, when the memory cells are read according to the program verify voltage Vvrf_P, a memory cell of which threshold voltage is lower than the program verify voltage Vvrf_P is recognized as an on cell. The on cell is accordingly known to not be programmed.

In a read operation, a read voltage Vrd_P is applied to word lines of selected memory cells. The read voltage Vrd_P is a voltage for determining whether the memory cells are in an erase state E or a program state P. When the memory cells are read according to the read voltage Vrd_P, a memory cell of which threshold voltage is higher than the read voltage Vrd_P is recognized as an off cell. The is off cell is accordingly known to be in the program state P. Conversely, when the memory cells are read according to the read voltage Vrd_P, a memory cell of which threshold voltage is lower than the read voltage Vrd_P is recognized as an on cell. The on cell is accordingly known to be in the erase state E.

If memory cells are programmed to have a threshold voltage higher than a limit threshold voltage Vlm_P of the program state P, the memory cells may have a default program state P and a new program state NP. In this case, the memory cells may have any one state of three states including en erase state E, the default program state P and the new program state NP. Increasing the number of program states of the memory cells increases the storage capacity of the memory cells.

As discussed above, in a program operation, setting information of the CAM block 170 (see FIG. 1) is updated on the basis of the program verify voltage provided from the controller 200. In the case where the setting information of the CAM block 170 is the default program verify voltage Vvrf_P, memory cells may be programmed to the default program state P according to the default program verify voltage Vvrf_P. If the setting information of the CAM block 170 is updated with a new program verify voltage Vvrf_NP from the controller 200, memory cells may be programmed to a program state higher than the default program state P, that is, the new program state NP, according to the updated program verify voltage Vvrf_NP.

In a read operation, the setting information of the CAM block 170 is updated based on the read voltage provided from the controller 200. In the case where the setting information of the CAM block 170 is the default read voltage Vrd_P from the controller 200, memory cells may be read according to the default read voltage Vrd_P. If the setting information of the CAM block 170 is updated with a new read voltage Vrd_NP from the controller 200, memory cells may be read according to the updated read voltage Vrd_NP.

Figure 6:
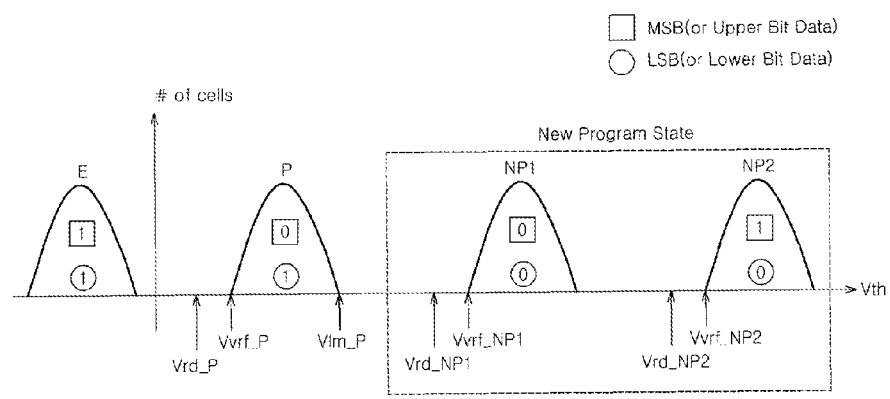
FIG. 6 is a threshold voltage distribution graph exemplarily explaining a program state of a memory cell in the case where a storage capacity of the memory cell is changed from 1-bit per cell to 2-bit per cell.
Figure 7:
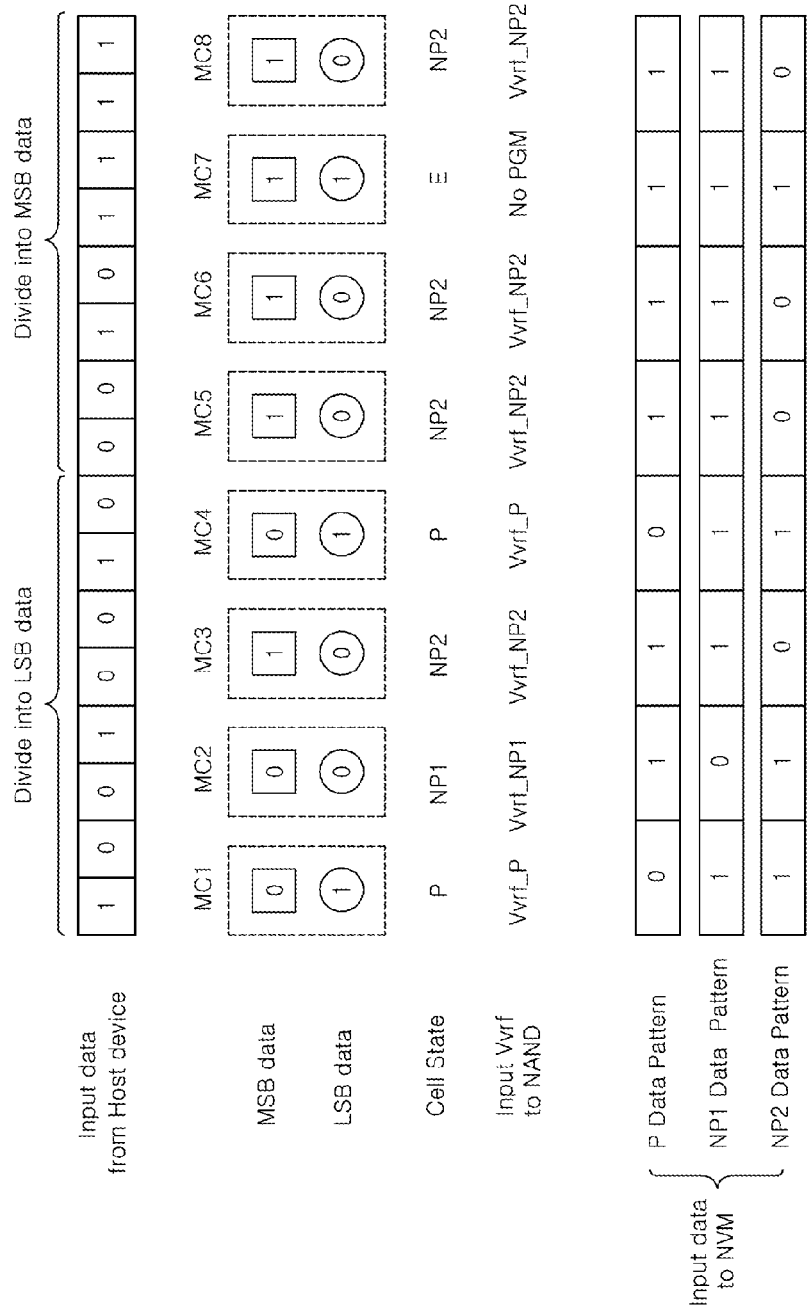
FIG. 7 is a diagram explaining a data pattern which is generated in the case where a storage capacity of the memory cell is changed from 1-bit per cell to 2-bit per cell.

FIG. 6 is a threshold voltage distribution graph exemplarily illustrating a program state of a memory cell in the case where a storage capacity of the memory cell is changed from 1 bit per cell to 2 bits per cell. In addition, FIG. 7 is a diagram illustrating a data pattern which is generated in the case where a storage capacity of the memory cell is changed from 1 bit per cell to 2 bits per cell.

If memory cells capable of storing 1 bit per cell are programmed to a default program state or to a new program state, a single level cell (SLC) may be used as a 2-bit multi-level cell (MLC) without physically changing a nonvolatile memory device. As shown in FIG. 6, a memory cell may be erased to have an erase state E, may be programmed to a default program state P according to a default program verify voltage Vvrf_P, may be programmed to a new program state NP1 according to a new program verify voltage Vvrf_NP1, or may be programmed to a new program state NP2 according to a new program verify voltage Vvrf_NP2. The new program states NP1 and NP2 have threshold voltages higher than a is limit threshold voltage Vlm_P of the default program state P.

In the case where 1-bit memory cells are programmed to store 2 bits per cell, the memory cells may be read according to a default read voltage Vrd_P, a new read voltage Vrd_NP1 and a new read voltage Vrd_NP2.

A memory cell capable of storing 2-bit data is programmed to have a threshold voltages corresponding to the erase state E and the program states P, NP1 and NP2 according to LSB (least significant bit) data and MSB (most significant bit) data. As the case may be, LSB data is referred to as lower bit data, and MSB data is referred to as upper bit data. A memory cell capable of storing 2-bit data is programmed to have a threshold voltage distribution according to a pair of data, that is, a combination of the LSB data and the MSB data.

Although a memory cell may be used as a multi-level cell (MLC) capable of storing 2-bit data according to the new program states NP1 and NP2, because circuit blocks for driving the memory cell are designed to drive a single level cell (SLC), data patterns should be generated such that the memory cell can be programmed to any one of the default program state P and the new program states NP1 and NP2. In other words, as shown in FIG. 7, a procedure for generating data patterns to program the data from the host device 400 (see FIG. 1), to any one of the default program state P and the new program states NP1 and NP2 through the data pattern generator 210 (see FIG. 1), is needed.

In describing FIG. 7, it is assumed that 16-bit data is input is from the host device 400. Further, it is assumed that the nonvolatile memory device 100 (see FIG. 4) includes 8 memory cells MC1 to MC8 which are accessed according to one page address.

The data pattern generator 210 divides the 16-bit data from the host device 400, by the number of bits for each of the memory cells MC1 to MC8, for example, 2. As a consequence, 8-bit LSB data and 8-bit MSB data are generated. The data pattern generator 210 arranges and combines the LSB data and the MSB data such that the 8-bit LSB data and the 8-bit MSB data are programmed to the 8 memory cells MC1 to MC8.

The data pattern generator 210 determines a threshold voltage distribution state for the memory cells MC1 to MC8 according to the result of combining the LSB data and the MSB data. For example, if MC7 should store a "11" state, the data pattern generator 210 selects a cell state for the memory cell MC7 in which the LSB data corresponds to data "1" and the MSB data corresponds to data "1", as the erase state E. In another example, if MC1 and MC4 should each store a "10" state, the data pattern generator 210 selects a cell state for the memory cells MC1 and MC4 in which the LSB data corresponds to data "1" and the MSB data corresponds to data "0", as the default program state P. In another example, if MC2 should store a "00" state, the data pattern generator 210 selects a cell state for memory cell MC2 in which the LSB data corresponds to data "0" and the MSB data corresponds to data "0", as the new program state NP1. In another example, if MC3, MC5, MC6, and MC8 is should each store a "01" state, the data pattern generator 210 selects a cell state for memory cells MC3, MC5, MC6 and MC8 in which the LSB data corresponds to data "0" and the MSB data corresponds to data "1", as the new program state NP2.

After determining the threshold voltage distribution state of the memory cells MC1 to MC8, the data pattern generator 210 generates data patterns (for example, a P data pattern, an NP1 data pattern and an NP2 data pattern) corresponding to the program states. Respective bit values of the data patterns correspond with respective states for the memory cells. For example, in the case of the memory cells MC1 and MC4 to be programmed to the default program state P, data patterns are generated such that the bit value of the P data pattern is "0", the bit value of the NP1 data pattern is "1" and the bit value of the NP2 data pattern is "1". In another example, in the case of the memory cell MC2 to be programmed to the new program state NP1, data patterns are generated such that the bit value of the P data pattern is "1", the bit value of the NP1 data pattern is "0" and the bit value of the NP2 data pattern is "1". In another example, in the case of the memory cells MC3, MC5, MC6 and MC8 to be programmed to the new program state NP2, data patterns are generated such that the bit value of the P data pattern is "1", the bit value of the NP1 data pattern is "1" and the bit value of the NP2 data pattern is "0". In another example, in the case of the memory cell MC7 to be programmed to the erase state E, data patterns are generated such that the bit value of the P data pattern is "1", the bit value of the NP1 data pattern is "1" and the bit value of the NP2 data pattern is "1". Accordingly, the respective bit values of the data patterns represent memory cells which are programmed according to corresponding data patterns when the data patterns are inputted to the nonvolatile memory device 100 (see FIG. 4).

A program verify voltage for programming a corresponding data pattern is provided each time a data pattern is input to the nonvolatile memory device 100. Data patterns and program verify voltages corresponding to the data patterns are sequentially provided. That is to say, as discussed above, if the program verify voltage Vvrf_P for programming to the default program state P and the P data pattern are provided, the nonvolatile memory device 100 performs a program operation. Also, if the program verify voltage Vvrf_NP1 for programming to the new program state NP1 and the NP1 data pattern are provided, the nonvolatile memory device 100 performs a program operation. Further, if the program verify voltage Vvrf_NP2 for programming to the new program state NP2 and the NP2 data pattern are provided, the nonvolatile memory device 100 performs a program operation.

The memory cells MC1 to MC8 in which the respective data patterns are stored are connected with one word line, and, for this reason, may operate concurrently. Accordingly, only one row address (that is, an address of a word line) for accessing the memory cells MC1 to MC8 is necessary. The memory cells MC1 to MC8 may store 2-bit data according to the respective data patterns (the P data pattern, the NP1 data pattern and the NP2 data pattern). When the data patterns are programmed, only one row address for designating a region where the data patterns are to be stored is provided to the nonvolatile memory device 100.

Figure 8:
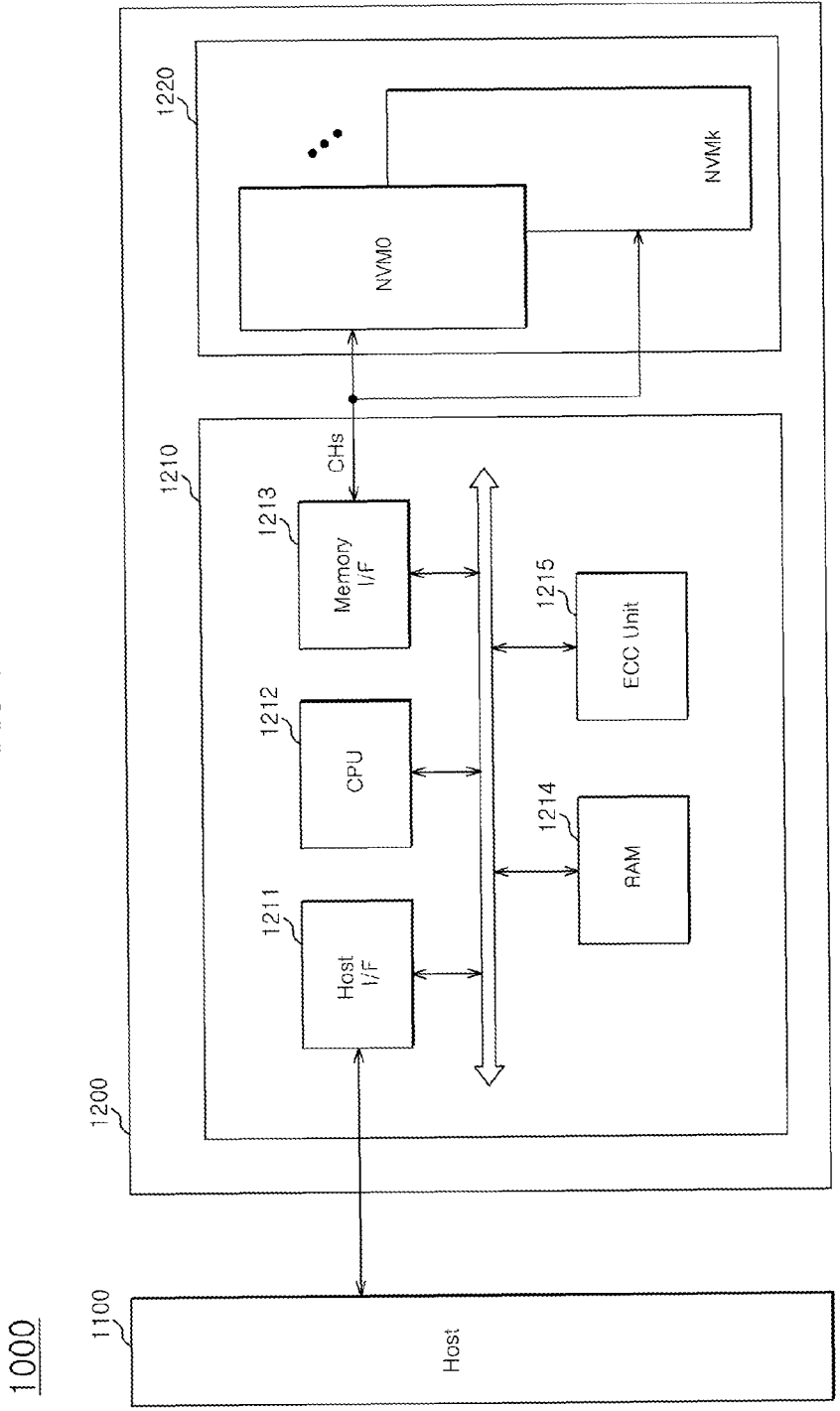
FIG. 8 is a block diagram exemplarily showing a data processing system in accordance with another embodiment.

FIG. 8 is a block diagram exemplarily showing a data processing system in accordance with another embodiment. Referring to FIG. 8, a data processing system 1000 includes a host 1100 and a data storage device 1200. The data storage device 1200 includes a controller 1210 and a data storage medium 1220. The data storage device 1200 may be used by being connected to the host 1100 such as a desktop computer, a notebook computer, a digital camera, a mobile phone, an MP3 player, a game machine, and the like. The data storage device 1200 is also referred to as a memory system.

The data storage device 1200 may increase memory storage area of the data storage medium 1220 through the method in accordance with the embodiments discussed above. Accordingly, the storage capacity of the data storage device 1200 may be increased.

The controller 1210 is connected to the host 1100 and the data storage medium 1220. The controller 1210 is configured to access the data storage medium 1220 in response to a request from the host 1100. For example, the controller 1210 is configured to control the read, program or erase operation of the data storage medium 1220. The controller 1210 is configured to drive a firmware for controlling the data storage medium 1220.

The controller 1210 may include well-known components such as a host interface 1211, a central processing unit 1212, a memory interface 1213, a RAM 1214, and an error correction code unit 1215. Other components may also be included.

The central processing unit 1212 is configured to control the general operations of the controller 1210 in response to a request from the host 1100. The RAM 1214 may be used as a working memory of the central processing unit 1212. The RAM 1214 may temporarily store the data read from the data storage medium 1220 or the data provided from the host 1100.

The host interface 1211 is configured to interface the host 1100 and the controller 1210. For example, the host interface 1211 may be configured to communicate with the host 1100 through one of various interface protocols such as a USB (universal serial bus) protocol, an MMC (multimedia card) protocol, a PCI (peripheral component interconnection) protocol, a PCI-E (PCI-express) protocol, a PATA (parallel advanced technology attachment) protocol, a SATA (serial ATA) protocol, an SCSI (small computer system interface) protocol, an SAS (serial attached SCSI) protocol, and an IDE (integrated drive electronics) protocol.

The memory interface 1213 is configured to interface the controller 1210 and the data storage medium 1220. The memory interface 1213 is configured to provide a command and an address to the data storage medium 1220. Furthermore, the memory interface 1213 is configured to exchange data with the data storage medium 1220.

The error correction code unit 1215 is configured to detect an error of the data read from the data storage medium 1220. Also, the error correction code unit 1215 is configured to correct the detected error when the detected error falls within a correction range. The error correction code unit 1215 may be inside or outside the controller 1210 depending on the memory system 1000.

The controller 1210 and the data storage medium 1220 may be configured as a solid state drive (SSD).

As another example, the controller 1210 and the data storage medium 1220 may be integrated into one semiconductor apparatus and may be configured as a memory card. For example, the controller 1210 and the data storage medium 1220 may be integrated into one semiconductor apparatus and may be configured as a PCMCIA (personal computer memory card international association) card, a CF (compact flash) card, a smart media card, a memory stick, a multimedia card (MMC, RS-MMC and MMC-micro), an SD (secure digital) card (SD, Mini-SD and Micro-SD), a UFS (universal flash storage), etc.

In another example, the controller 1210 or the data storage medium 1220 may be mounted as various types of packages. For example, the controller 1210 or the data storage medium 1220 may be mounted by being packaged into types such as a POP (package on package), a ball grid array (BGA) package, a chip scale package (CSP), a plastic leaded chip carrier (PLCC), a plastic dual in-line package (PDIP), a die in waffle pack, a die in wafer form, a chip on board (COB), a ceramic dual in-line package (CERDIP), a plastic metric quad flat package (MQFP), a thin quad flat package (TQFP), a small outline IC (SOIC), a shrink small outline package (SSOP), a thin small outline package (TSOP), a thin quad flat package (TQFP), a system in package (SIP), a multi-chip package (MCP), a wafer-level fabricated package (WFP), and a wafer-level processed stack package (WSP).

Figure 9:
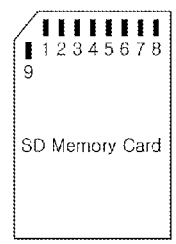
FIG. 9 is a diagram exemplarily showing a memory card in accordance with an embodiment.

FIG. 9 is a diagram exemplarily showing a memory card in accordance with an embodiment. FIG. 9 shows the outer appearance of an SD (secure digital) card among memory cards.

Referring to FIG. 9, the SD card includes one command pin (for example, a second pin), one clock pin (for example, a fifth pin), four data pins (for example, first, seventh, eighth and ninth pins), and three power pins (for example, third, fourth and sixth pins).

Through the command pin (the second pin), a command and a response signal are transmitted. In general, the command is transmitted to the SD card from a host, and the response signal is transmitted to the host from the SD card.

The data pins (the first, seventh, eighth and ninth pins) are divided into reception (Rx) pins for receiving data transmitted from the host and transmission (Tx) pins for transmitting data to the host. The reception (Rx) pins and the transmission (Tx) pins are provided in pairs to transmit differential signals.

Figure 10:
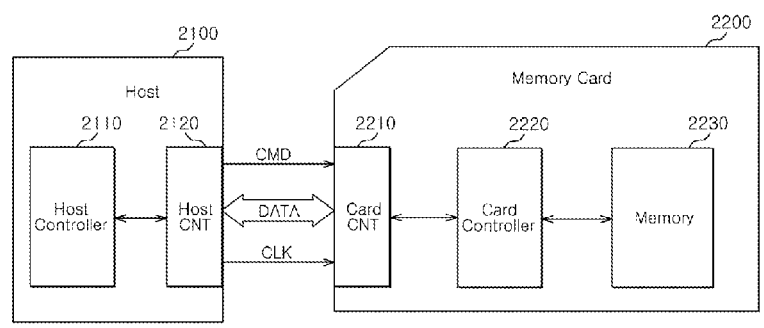
FIG. 10 is a block diagram showing the internal configuration of the memory card shown in FIG. 9 and the connection relationship between the memory card and a host.

FIG. 10 is a block diagram showing the internal is configuration of the memory card shown in FIG. 9 and the connection relationship between the memory card and a host. Referring to FIG. 10, a data processing system 2000 includes a host 2100 and a memory card 2200. The host 2100 includes a host controller 2110 and a host connection unit 2120. The memory card 2200 includes a card connection unit 2210, a card controller 2220, and a memory device 2230.

The host connection unit 2120 and the card connection unit 2210 include a plurality of pins. The pins may include a command pin, a clock pin, a data pin, and a power pin. The number of pins changes depending on the kind of the memory card 2200.

The host 2100 stores data in the memory card 2200 or reads data stored in the memory card 2200.

The host controller 2110 transmits a write command CMD, a clock signal CLK generated from a clock generator (not shown) in the host 2100, and data DATA to the memory card 2200 through the host connection unit 2120. The card controller 2220 operates in response to the write command received through the card connection unit 2210. The card controller 2220 stores the received data DATA in the memory device 2230, using a clock signal generated from a clock generator (not shown) in the card controller 2220, according to the received clock signal CLK.

The host controller 2110 transmits a read command CMD and a clock signal CLK generated from a clock generator (not shown) in the host 2100 to the memory card 2200 through the host connection unit 2120. The card controller 2220 operates in response to the read command received through the card connection unit 2210. The card controller 2220 reads data from the memory device 2230 using a clock signal generated from a clock generator (not shown) in the card controller 2220, according to the received clock signal CLK, and transmits the read data to the host controller 2110.

The card controller 2220 may enlarge a storage area of the memory device 2230 through the method in accordance with the embodiment. Accordingly, the storage capacity of the memory card 2200 may be increased.

Figure 11:
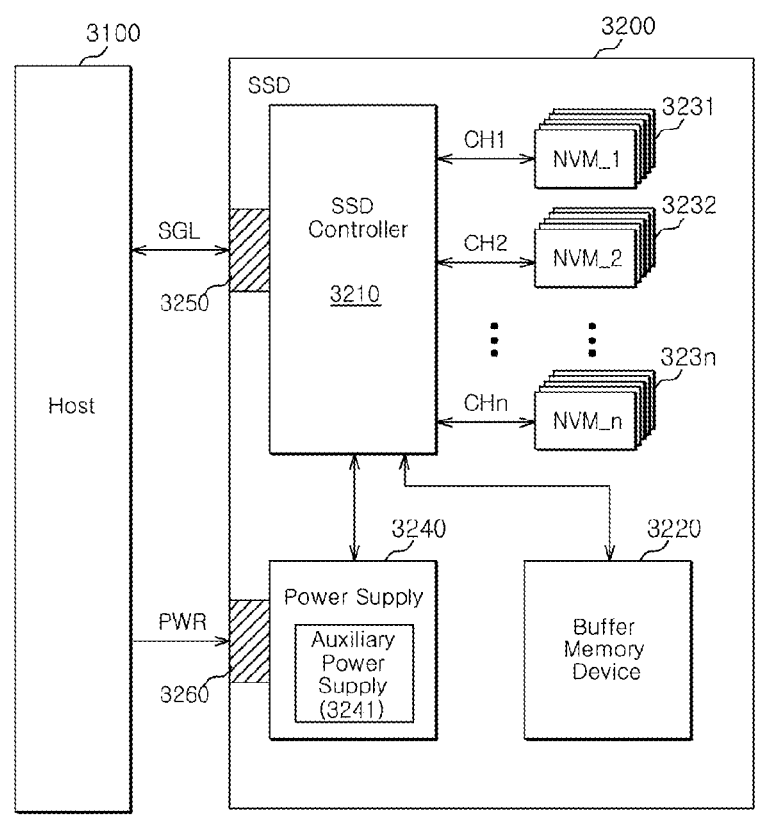
FIG. 11 is a block diagram showing an SSD in accordance with an embodiment.

FIG. 11 is a block diagram showing an SSD in accordance with an embodiment. Referring to FIG. 11, a data processing system 3000 includes a host 3100 and an SSD 3200.

The SSD 3200 includes an SSD controller 3210, a buffer memory device 3220, nonvolatile memory devices 3231 to 323n, a power supply 3240, a signal connector 3250, and a power connector 3260.

The SSD 3200 operates in response to a request from the host 3100. That is to say, the SSD controller 3210 is configured to access the nonvolatile memory devices 3231 to 323n in response to a request from the host 3100. For example, the SSD controller 3210 is configured to control read, program and erase operations of the nonvolatile memory devices 3231 to 323n. Further, the SSD controller 3210 may enlarge storage areas of the nonvolatile memory devices 3231 to 323n through the method in accordance with the embodiment. Accordingly, the storage capacity of the SSD 3200 may be increased.

The buffer memory device 3220 is configured to temporarily store data which are to be stored in the nonvolatile memory devices 3231 to 323n. Further, the buffer memory device 3220 is configured to temporarily store data which are read from the nonvolatile memory devices 3231 to 323n. The data temporarily stored in the buffer memory device 3220 are transmitted to the host 3100 or the nonvolatile memory devices 3231 to 323n under the control of the SSD controller 3210.

The nonvolatile memory devices 3231 to 323n are used as storage media of the SSD 3200. The nonvolatile memory devices 3231 to 323n are connected to the SSD controller 3210 through a plurality of channels CH1 to CHn, respectively. One or more nonvolatile memory devices may be connected to one channel. The nonvolatile memory devices connected to one channel are connected to the same signal bus and data bus.

The power supply 3240 is configured to provide power PWR inputted through the power connector 3260 to the inside of the SSD 3200. The power supply 3240 includes an auxiliary power supply 3241. The auxiliary power supply 3241 is configured to supply power so as to allow the SSD 3200 to be normally terminated when sudden power-off occurs. The auxiliary power supply 3241 may include super capacitors capable of being charged with power PWR.

The SSD controller 3210 exchanges a signal SGL with the is host 3100 through the signal connector 3250. Here, the signal SGL includes a command, an address, data, and the like. The signal connector 3250 may be constituted by a connector such as PATA (parallel advanced technology attachment), SATA (aerial advanced technology attachment), SCSI (small computer system interface), SAS (serial SCSI), and the like, according to an interface scheme between the host 3100 and the SSD 3200.

Figure 12:
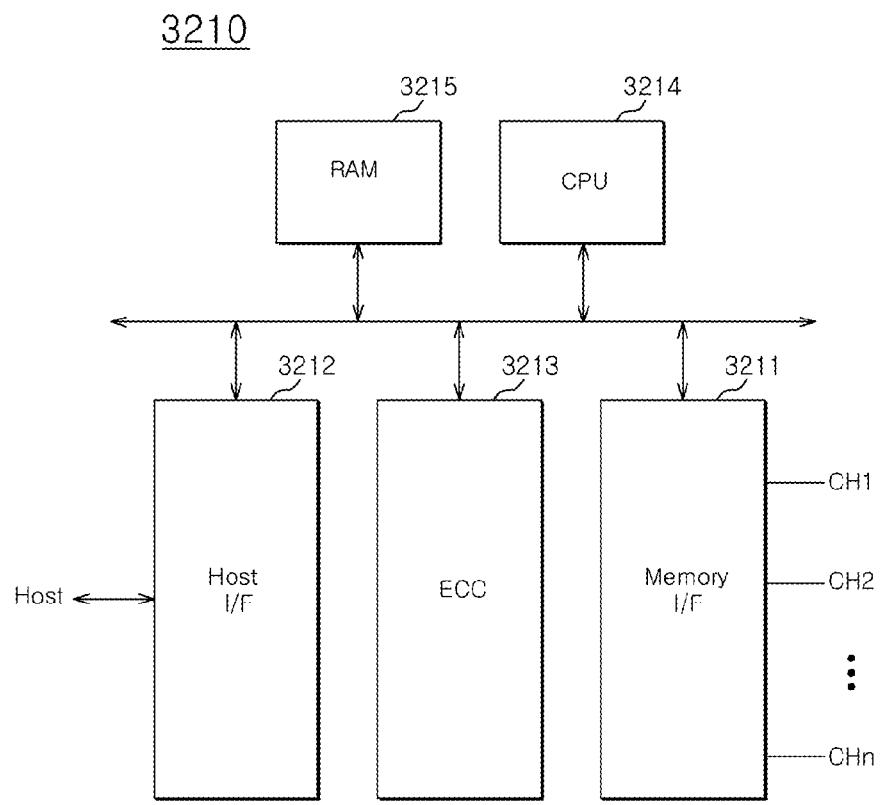
FIG. 12 is a block diagram exemplarily showing the SSD controller shown in FIG. 11.

FIG. 12 is a block diagram exemplarily showing the SSD controller shown in FIG. 11. Referring to FIG. 12, the SSD controller 3210 includes a memory interface 3211, a host interface 3212, an ECC unit 3213, a central processing unit 3214, and a RAM 3215.

The memory interface 3211 is configured to provide a command and an address to the nonvolatile memory devices 3231 to 323n. Moreover, the memory interface 3211 is configured to exchange data with the nonvolatile memory devices 3231 to 323n. The memory interface 3211 may scatter data transmitted from the buffer memory device 3220 to the respective channels CH1 to CHn, under the control of the central processing unit 3214. Furthermore, the memory interface 3211 transmits data read from the nonvolatile memory devices 3231 to 323n to the buffer memory device 3220, under the control of the central processing unit 3214.

The host interface 3212 is configured to provide an interface with the SSD 3200 in correspondence to the protocol of the host 3100. For example, the host interface 3212 may be configured to communicate with the host 3100 through one of PATA (parallel advanced technology attachment), SATA (serial advanced technology attachment), SCSI (small computer system interface) and SAS (serial SCSI) protocols. In addition, the host interface 3212 may perform a disk emulation function of supporting the host 3100 to recognize the SSD 3200 as a hard disk drive (HDD).

The ECC unit 3213 is configured to generate parity bits based on the data transmitted to the nonvolatile memory devices 3231 to 323n. The generated parity bits may be stored in spare areas of the nonvolatile memory devices 3231 to 323n. The ECC unit 3213 is configured to detect an error of data read from the nonvolatile memory devices 3231 to 323n. When the detected error falls within a correction range, the ECC unit 3213 is configured to correct the detected error.

The central processing unit 3214 is configured to analyze and process a signal SGL inputted from the host 3100. The central processing unit 3214 controls general operations of the SSD controller 3210 in response to a request from the host 3100. The central processing unit 3214 controls the operations of the buffer memory device 3220 and the nonvolatile memory devices 3231 to 323n according to a firmware for driving the SSD 3200. The RAM 3215 is used as a working memory device for driving the firmware.

Figure 13:
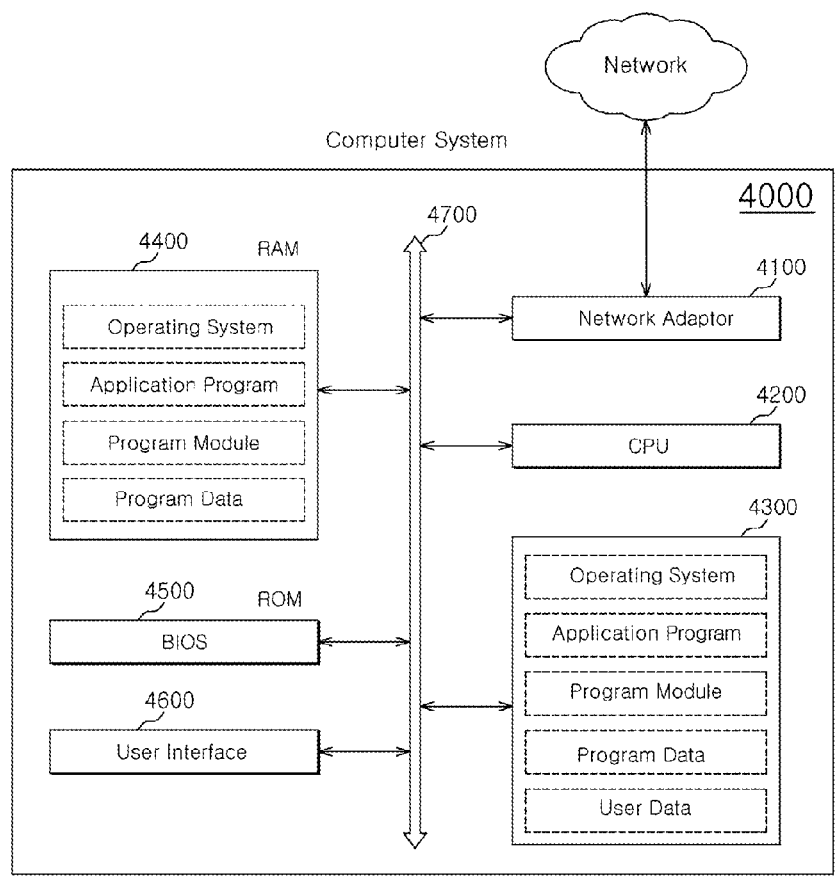
FIG. 13 is a block diagram exemplarily showing a computer system in which a data storage device in accordance with an embodiment is mounted.

FIG. 13 is a block diagram exemplarily showing a computer system in which a data storage device in accordance with an embodiment is mounted. Referring to FIG. 13, a computer system 4000 includes a network adaptor 4100, a central processing unit 4200, a data storage device 4300, a RAM 4400, a ROM 4500 and a user interface, which are electrically connected to a system bus 4700. The data storage device 4300 may be constituted by the data storage device 300 shown in FIG. 1, the data storage device 1200 shown in FIG. 8 or the SSD 3200 shown in FIG. 11.

The network adaptor 4100 provides interfacing between the computer system 4000 and external networks. The central processing unit 4200 performs general operation processing for driving an operating system residing at the RAM 4400 or an application program.

The data storage device 4300 stores general data necessary in the computer system 4000. For example, an operating system for driving the computer system 4000, an application program, various program modules, program data and user data are stored in the data storage device 4300.

The RAM 4400 may be used as a working memory device of the computer system 4000. Upon booting, the operating system, the application program, the various program modules and the program data necessary for driving programs, which are read from the data storage device 4300, are loaded on the RAM 4400. A BIOS (basic input/output system) which is activated before the operating system is driven is stored in the ROM 4500. Information exchange between the computer system 4000 and a user is implemented through the user interface 4600.

Although not shown in a drawing, it is to be readily is understood that the computer system 4000 may further include devices such as an application chipset, a camera image processor (CIS), and the like.

As is apparent from the above descriptions, according to the embodiments, it is possible to control a memory device to have an increased storage capacity when compared to a storage capacity of a memory cell which is decided at a design stage. Accordingly, a storage capacity of a data storage device can be increased.

While the present invention has been particularly shown and described with reference to exemplary embodiments thereof, it will be understood by those of ordinary skill in the art that various changes in form and details may be made therein without departing from the spirit and scope of the present invention.

What is claimed is:

1. A method of operating a data storage device, the method comprising:
   setting a plurality of program verify voltages for verifying whether memory cells of a nonvolatile memory device are programmed to one of a plurality of program states;
   transmitting one of the program verify voltages to the nonvolatile memory device;
   generating a data pattern corresponding to the one of a plurality of program state, wherein the data pattern is based on the transmitted program verify voltage;
   transmitting the data pattern to the memory device; and
   programming the memory cells with the data pattern according to the transmitted program verify voltage.

2. The operating method according to claim 1, wherein generating the data pattern comprises:
   dividing data input from a host device by the number of bits capable of being stored in each of the memory cells to generate divided data;
   combining the divided data according to the number of bits capable of being stored in each cell of the memory cells to generate combined data;
   comparing bit data of the combined data with bit data corresponding to each of the program states to determine which program state corresponds to the combined data for each of the memory cells; and
   generating data patterns corresponding to the program states for the memory cells.

3. The operating method according to claim 2, wherein the data patterns are generated such that bit values of the respective data patterns correspond to program states for the respective memory cells.

4. The operating method according to claim 2, wherein the data patterns and program verify voltages respectively corresponding to the data patterns are sequentially transmitted until the memory cells are programmed.

5. The operating method according to claim 4, further comprising:
   transmitting only one row address to program the memory cells.

6. The operating method according to claim 1, wherein the program states comprise:
   a default program state of the memory cells, and
   at least one new program state for increasing storage capacity of the memory cells.

7. The operating method according to claim 6, wherein the new program state has a threshold voltage higher than a limit threshold voltage of the default program state.

8. The operating method according to claim 6, wherein the storage capacity is increased from 1 bit to 2 bits.

9. The operating method according to claim 6, wherein the storage capacity is increased from 2 bits to at least 3 bits.

10. The operating method according to claim 1, further comprising:
    updating a program verify voltage of the nonvolatile memory device on the basis of the transmitted program verify voltage.

11. The operating method according to claim 1, further comprising:
    setting read voltages for reading program states which are based on the program verify voltages;
    transmitting one of the read voltages to the nonvolatile memory device; and
    reading the memory cells according to the transmitted read voltage.

12. A data storage device comprising:
    a nonvolatile memory device including memory cells; and
    a controller configured to control the nonvolatile memory device,
    wherein the controller is configured to set a plurality of program verify voltages for verifying whether the memory cells are programmed to one of a plurality of program states, and to provide the program verify voltages to the nonvolatile memory device, and
    wherein the nonvolatile memory device is configured to update a program verify voltage based on the program verify voltage provided from the controller and to perform a program operation according to the updated program verify voltage.

13. The data storage device according to claim 12, wherein the controller is configured to provide a default program verify voltage for verifying whether the memory cells are programmed to a default program state and a new program verify voltage for verifying whether the memory cells are programmed to a new program state, wherein the new program state has a threshold voltage higher than a limit threshold voltage of the default program state.

14. The data storage device according to claim 12, wherein the controller includes a data pattern generator configured to generate data patterns respectively corresponding to program states of the memory cells which correspond to the program verify voltages provided to the nonvolatile memory device.

15. The data storage device according to claim 14, wherein the data pattern generator is configured to divide data input from a host device by the number of bits capable of being stored in each of the memory cells to generate divided data, to combine the divided data according to the number of bits capable of being stored in each of the memory cells to generate combined data, and to generate data patterns corresponding to the program states for the memory cells, wherein the program states are determined based on the combined data.

16. The data storage device according to claim 12, wherein the nonvolatile memory device includes a CAM (content addressed memory) block configured to store one of the program verify voltages, and to update the one stored program verify voltage with the program verify voltage provided from the controller.

17. The data storage device according to claim 12, wherein the nonvolatile memory device and the controller are part of a memory card.

18. The data storage device according to claim 12, wherein the nonvolatile memory device and the controller are part of a solid state drive.

19. A method of operating a data storage device comprising memory cells, the method comprising:
    determining a default program state for each of the memory cells;
    adding a new valid program state for the memory cells;
    receiving input data from a host device;
    generating a data pattern configured to program each of the memory cells to one of the default program state and the new program state according to the input data;
    transmitting the data pattern to the memory cells; and
    programming the memory cells with the data pattern according to the transmitted program verify voltages.

20. The operating method according to claim 19, wherein generating the data pattern comprises:
    mapping each of a plurality of groups of bits of the input data to one of a plurality of programming patterns, wherein each of the programming patterns is configured to program the memory cells to one of the valid program states.

21. The operating method according to claim 19, wherein the data pattern is configured to program each of the memory cells to one of: the default program state, the new program state, and an erase state according to the input data.

* * * * *